United States Patent [19]
Patterson et al.

[11] 4,097,653
[45] Jun. 27, 1978

[54] COBALT BORIDE CONDUCTOR COMPOSITIONS

[75] Inventors: Frank Knowles Patterson, Wilmington; Joseph Richard Rellick, Newark, both of Del.

[73] Assignee: E. I. Du Pont de Nemours and Company, Wilmington, Del.

[21] Appl. No.: 775,275

[22] Filed: Mar. 7, 1977

[51] Int. Cl.² ............................................. H01B 1/06
[52] U.S. Cl. ................................. 428/433; 428/427; 428/539; 252/513; 252/519; 106/1.27
[58] Field of Search ................... 252/519, 513; 106/1; 428/433, 539, 427; 423/289; 75/170

[56] References Cited

U.S. PATENT DOCUMENTS 3,857,683  12/1974  Castonguay ........................... 29/195
3,929,674  12/1975  Patterson ............................. 106/1 X

OTHER PUBLICATIONS

N. N. Greenwood et al., "Metal Borides," Quarterly Reviews 20, pp. 441–464.

Primary Examiner—Benjamin R. Padgett
Assistant Examiner—E. Suzanne Parr

[57] ABSTRACT

Cobalt boride conductor compositions of certain cobalt borides and, optionally, inorganic binder, dispersed in a vehicle and fireable in air to produce conductive films on substrates. Also the resultant sintered (fired) films.

19 Claims, No Drawings

COBALT BORIDE CONDUCTOR COMPOSITIONS

BACKGROUND OF THE INVENTION

This invention relates to electronics, and more particularly to compositions useful for producing conductor patterns adherent to substrates.

Conductor compositions which are applied to and fired on dielectric substrates (glass, glass-ceramic, and ceramic) usually comprise finely divided inorganic powders (e.g., metal particles and binder particles) and are commonly applied to substrates using so-called "thick film" techniques, as a dispersion of these inorganic powders in an inert liquid medium or vehicle. Upon firing or sintering of the printed film, the metallic component of the composition provides the functional (conductive) utility, while the inorganic binder (e.g., glass, $Bi_2O_3$, etc.) bonds the metal particles to one another and to the substrate. Thick film techniques are contrasted with thin film techniques which involve deposition of particles by evaporation or sputtering. Thick film techniques are generally discussed in "Handbook of Materials and Processes for Electronics," C. A. Harper, Editor, McGraw-Hill, N.Y., 1970, Chapter 12.

The most commonly used conductor compositions employ noble metals, especially gold, silver, platinum, palladium, and their mixtures and alloys, since their relatively inert characteristics permit firing in air. Many attempts at using dispersions of less expensive non-noble metals have been confined to specialized uses or have required the great practical inconvenience and expense of firing in non-oxidizing atmospheres (nitrogen, nitrogen/hydrogen, hydrogen, argon, etc.). Patterson U.S. Pat. No. 3,943,168 issued Mar. 9, 1976 discloses certain nickel borides and boride/silicides.

There is a distinct commercial need for base-metal conductor compositions which can be fired in air to produce adherent low resistivity conductors on dielectric substrates, including microcircuit patterns, end terminations for capacitors, etc.

There is also a need for base-metal conductor compositions which can be fired at low temperatures even as low as 500° C., yet produce good conductivity.

SUMMARY OF THE INVENTION

This invention provides conductor compositions of finely divided inorganic powder dispersed in an inert liquid vehicle fireable in air to produce conductive films. The inorganic powder comprises a material of the formula $Co_xB_y$, prepared by melting the respective elements together, cooling and comminuting the resultant cooled product (ingot) to a powder. In $Co_xB_y$, x and y total 100, and represent atomic ratios, and are in the approximate range x equal to 50–75 and y equal to 25–50, preferably x equal to 60–71 and y equal to 29–40, more preferably x equal to 65–71 and y equal to 29–35.

An inorganic binder powder such as glass may also be present, the relative amounts of cobalt boride and binder being, by weight, 50–100% $Co_xB_y$ and 0–50% binder, preferably 60–98% $Co_xB_y$ and 2–40% binder, more preferably 75–96% $Co_xB_y$ and 4–25% binder. The inorganic binder powder serves to bind the fired film particles to one another and to the substrate.

Of course, independently prepared cobalt borides may be mixed to produce the stoichiometry claimed. Also, cobalt metal powder may be blended with the cobalt borides of this invention to enrich the cobalt content of these compositions.

The higher boron contents are preferred for firing at higher temperatures in the presence of an inorganic binder to produce low resistivity.

These compositions are printed on dielectric substrates and fired in air (e.g. at a peak temperature in the range 500°–1000° C. for at least 2 minutes, preferably 10 minutes) to produce adherent electrically continuous sintered (fired) patterns, useful in the electronics art. The chemical nature of the fired film may be different from that of the starting composition, especially when the composition is fired in air. Firing may also be conducted in nitrogen, argon, etc.

The proportion of inorganic powder to vehicle is a matter of choice, depending upon the desired viscosity, but normally there is 60–80% inorganic powder and 20–40% vehicle. The compositions may, of course, be modified by the addition of other materials not affecting their beneficial characteristics.

Cobalt boride compositions can provide advantages over nickel boride compositions since cobalt has lower magnetic permeability than does nickel. Lower magnetic permeability is important in microwave circuits to reduce losses and in microcircuits to reduce coupling of adjacent conductors.

DETAILED DESCRIPTION OF THE INVENTION

The essential component in these compositions is the aforementioned cobalt boride, $Co_xB_y$, a melted and comminuted product of reaction of the elements. It is thought that over most of the composition range claimed a single phase cobalt boride product is not present. However, even where more than one phase is present, so long as the product is within the claimed range and was melted, it is of the invention.

Any conventional electronic glass powder may be used as the inorganic binder in the compositions of the present invention, as known to those skilled in the art, including, for example, those of Larson and Short U.S. Pat. No. 2,822,279 (issued Feb. 4, 1958); Short U.S. Pat. No. 2,819,170 (issued Jan. 7, 1958); etc. Lead borosilicates are preferred.

All the inorganic powders used herein are finely divided, i.e., pass through a 400-mesh screen. It is preferred that substantially all the particles have a largest dimension ("diameter") of 5 microns or less. Smaller particle sizes will tend to oxidize more rapidly than larger ones.

The inorganic particles are dispersed in an inert liquid vehicle by mechanical mixing (e.g., on a roll mill) to form a paste-like composition. The dispersion is printed as "thick film" on conventional dielectric substrates in the conventional manner. Any inert liquid may be used as the vehicle. Any of various organic liquids, with or without thickening and/or stabilizing agents and/or other common additives, may be used as the vehicle. Exemplary of the organic liquids which can be used are the aliphatic alcohols; esters of such alcohols, for example, the acetates and propionates; terpenes such as pine oil, terpineol and the like; solutions of resins such as the polymethacrylates of lower alcohols, or solutions of ethyl cellulose, in solvents such as pine oil and the monobutyl ether of ethylene glycol monoacetate. The vehicle may contain or be composed of volatile liquids to promote fast setting after application to the substrate.

After printing the dispersions on a substrate and drying to remove the vehicle, firing of the compositions of the present invention is carried out at temperatures and for times sufficient to sinter the inorganic materials and to produce conductor patterns adherent to the dielectric substrate, as discussed above.

EXAMPLES

The following examples and comparative drawings illustrate the scope of the present invention. In the examples and elsewhere in the specification and claims, all parts, percentages, ratios, etc. are by weight unless otherwise stated. Of course, in the cobalt boride formula, atomic ratios are intended. All mesh sizes are U.S. standard sieve scale. All firings were done in air.

PREPARATION OF COBALT BORIDE MATERIALS

The cobalt boride materials of this invention were prepared by melting cobalt and boron powder in appropriate ratios at 1200°–1400° C. in a high-purity alumina crucible under an atmosphere of purified argon. The starting materials were usually 90–92% purity Trona amorphous boron (American Potash and Chemical Corporation) and 99.4% cobalt C-363 (Fisher Scientific Company). The ratios given in the Table for Co/B are atomic ratios taking into account the purity of the starting material boron (91%). Heating (by an induction furnace) was generally 100°–300° C. above the temperature at which the charge was entirely molten. Once the charge was molten, it was held at the maximum temperature for about 10–15 minutes. After the melting step, the charge was cooled to an ingot, which was comminuted to a particle size such that the resultant powder passed through at least a 400-mesh screen.

PREPARATION OF CONDUCTIVE FILMS

The cobalt boride materials were dispersed in a vehicle of about 1 part ethyl cellulose and 9 parts terpineol. In some experiments a glass was present (78.1% PbO, 5.4% $SiO_2$, 12.4% $B_2O_3$ and 4.1% $Al_2O_3$). The ratio of inorganic solids (cobalt material and glass, if any) to vehicle was about 5/1 (see the Table). The dispersions were printed on dense alumina substrates through a 200-mesh patterned screen as a 200-square serpentine conductor pattern (20 mils or 0.5 mm. wide by 4 in. or 10.2 cm. long). After being dried at 125° C. for 10 minutes, the printed substrates were fired at 325° C. for 10 minutes, and then plunged into a preheated box furnace preheated at a temperature in the range between 500° C. and 900° C. (as indicated in the Table), and held at the stated temperature for 10 minutes. The resulting fired films were about 0.7 mil (15 microns) thick. The Table reports the composition used and resistivities found at each temperature. Resistivity was determined using a Triplett Model 8035 Type 1 digital volt/ohmmeter.

Examples 1–6 used various Co/B ratios and no binder, while Examples 7–12 used a binder. Adherent fired films were obtained in each example. At lower B content in the presence of binder, infinite resistance was obtained at some elevated firing temperatures. Hence, as is known to those skilled in the art, materials, proportions and firing temperatures are selected dependent upon results desired and firing conditions needed.

Table

SHEET RESISTIVITY FOR COMPOSITIONS OF COBALT BORIDES FIRED AT VARIOUS TEMPERATURES

| Ex. | Composition Inorganic Powder Alloy | Glass | Vehicle | Sheet Resistivity (Milliohms/sq. at 0.7 mil Thickness) 500° C | 600° C | 700° C | 800° C | 900° C |
|---|---|---|---|---|---|---|---|---|
| 1 | 2.5 g $Co_{75}B_{25}$ | — | 0.5 g | 291 | 67.5 | 67.5 | 29 | 17.5 |
| 2 | 2.5 g $Co_{71}B_{29}$ | — | 0.5 g | 4385 | 67.0 | 37.5 | 25 | 18.5 |
| 3 | 2.5 g $Co_{66}B_{34}$ | — | 0.5 g | 493 | 66.5 | 39 | 24.5 | 18 |
| 4 | 2.5 g $Co_{60}B_{40}$ | — | 0.5 g | 2565 | 147.5 | 59 | 39.5 | 26 |
| 5 | 2.5 g $Co_{55}B_{45}$ | — | 0.5 g | 5890 | 335.5 | 80 | 54.5 | 34.5 |
| 6 | 2.5 g $Co_{50}B_{50}$ | — | 0.5 g | 2175 | 293.5 | 111.5 | 67.5 | 53.5 |
| 7 | 2.2 g $Co_{75}B_{25}$ | 0.3 g | 0.5 g | 2160 | 5180 | ∞ | ∞ | ∞ |
| 8 | 2.2 g $Co_{71}B_{29}$ | 0.3 g | 0.5 g | 1090 | 55 | 60 | 62 | ∞ |
| 9 | 2.2 g $Co_{66}B_{34}$ | 0.3 g | 0.5 g | 286 | 68 | 42 | 36 | 25 |
| 10 | 2.2 g $Co_{60}B_{40}$ | 0.3 g | 0.5 g | 640 | 111 | 60 | 36 | 26 |
| 11 | 2.2 g $Co_{55}B_{45}$ | 0.3 g | 0.5 g | 770 | 147 | 81 | 53 | 28 |
| 12 | 2.2 g $Co_{50}B_{50}$ | 0.3 g | 0.5 g | 675 | 169 | 105 | 80 | 32 |

We claim:

1. Conductor compositions of finely divided inorganic powder dispersed in an inert liquid vehicle, the inorganic powder consisting essentially of 50–100 wt.% $Co_xB_y$ wherein
   x is in the approximate range 50–75,
   y is in the approximate range 25–50, and
   x and y total 100 and are atomic ratios, and 0–50 wt.% inorganic binder.
2. Conductor compositions according to claim 1 wherein
   x is in the approximate range 60–71 and
   y is in the approximate range 29–40.
3. Compositions according to claim 2 wherein
   x is in the approximate range 65–71 and
   y is in the approximate range 29–35.
4. Compositions according to claim 1 of 60–98 wt.% $Co_xB_y$ and 2–40 wt.% inorganic binder.
5. Compositions according to claim 2 of 60–98 wt.% $Co_xB_y$ and 2–40 wt.% inorganic binder.
6. Compositions according to claim 3 of 60–98 wt.% $Co_xB_y$ and 2–40 wt.% inorganic binder.
7. Compositions according to claim 4 of 75–96% $Co_xB_y$ and 4–25% inorganic binder.
8. Compositions according to claim 5 of 75–96% $Co_xB_y$ and 4–25% inorganic binder.
9. Compositions according to claim 6 of 75–96% $Co_xB_y$ and 4–25% inorganic binder.
10. Compositions according to claim 1 wherein the inorganic binder is glass.
11. Compositions according to claim 2 wherein the inorganic binder is glass.
12. Compositions according to claim 3 wherein the inorganic binder is glass.
13. Compositions according to claim 4 wherein the inorganic binder is glass.
14. Compositions according to claim 7 wherein the inorganic binder is glass.
15. A dielectric substrate having adherent thereto the fired composition of claim 1.
16. A dielectric substrate having adherent thereto the fired composition of claim 2.
17. A dielectric substrate having adherent thereto the fired composition of claim 3.
18. A dielectric substrate having adherent thereto the fired composition of claim 7.
19. A dielectric substrate having adherent thereto the fired composition of claim 10.

* * * * *